(12) United States Patent
Peukert et al.

(10) Patent No.: US 8,307,839 B2
(45) Date of Patent: Nov. 13, 2012

(54) DISHWASHER WITH A LATENT HEAT ACCUMULATOR

(75) Inventors: Thomas Peukert, Oberkirch (DE); Bruno Gaus, Offenburg (DE); Thomas Naeger, Offenburg (DE)

(73) Assignee: Meiko Maschinenbau GmbH & Co. KG, Offenburg (DE)

( * ) Notice: Subject to any disclaimer, the term of this patent is extended or adjusted under 35 U.S.C. 154(b) by 567 days.

(21) Appl. No.: 12/267,062

(22) Filed: Nov. 7, 2008

(65) Prior Publication Data
US 2009/0120465 A1    May 14, 2009

(30) Foreign Application Priority Data

Nov. 9, 2007  (DE) .......................... 10 2007 053 381

(51) Int. Cl.
*B08B 3/00* (2006.01)
*B08B 7/00* (2006.01)
*B08B 9/20* (2006.01)
(52) U.S. Cl. ...................... 134/107; 134/25.2; 134/56 D; 134/57 D; 134/58 D; 134/105; 134/108; 134/124
(58) Field of Classification Search .................. 134/25.2, 134/57 D, 56 D, 58 D, 184, 61, 95.1, 95.2, 134/94.1, 124, 105, 107, 108
See application file for complete search history.

(56) References Cited

U.S. PATENT DOCUMENTS

| | | | |
|---|---|---|---|
| 3,125,898 A | 3/1964 | Maples et al. | |
| 3,598,131 A | 8/1971 | Weihe, Jr. | |
| 4,189,393 A * | 2/1980 | Schroder et al. | 252/70 |
| 4,341,649 A * | 7/1982 | Burns et al. | 252/70 |
| 4,708,812 A * | 11/1987 | Hatfield | 252/70 |
| 7,604,014 B2 | 10/2009 | Paintner | |
| 7,676,954 B2 | 3/2010 | Classen et al. | |
| 2004/0029472 A1* | 2/2004 | Lin | 442/131 |
| 2007/0089763 A1* | 4/2007 | Paintner | 134/56 D |
| 2007/0131260 A1 | 6/2007 | Scheringer et al. | |
| 2007/0240738 A1 | 10/2007 | Heissler et al. | |
| 2009/0101174 A1* | 4/2009 | Gaus et al. | 134/18 |

FOREIGN PATENT DOCUMENTS

| | | |
|---|---|---|
| DE | 29 16 839 A1 | 11/1980 |
| DE | 37 00 567 A1 | 7/1988 |
| DE | 37 41 652 A1 | 6/1989 |

(Continued)

*Primary Examiner* — Alexander Markoff
(74) *Attorney, Agent, or Firm* — Muncy, Geissler, Olds & Lowe, PLLC

(57) ABSTRACT

A cleaning appliance is provided for cleaning washware, which cleaning appliance is designed to subject the washware to the action of at least one cleaning fluid in at least one cleaning chamber. The cleaning appliance has a suction-removal apparatus for removing damp air from the cleaning chamber by suction, and at least one heat recovery device. The heat recovery device is designed to draw heat from the damp air and to feed it back to the cleaning appliance by means of a first cooling fluid. The cleaning appliance has a cooling-fluid line with at least one recirculation path and at least one heat accumulator path with at least one latent heat accumulator. The cleaning appliance is designed to conduct the first cooling fluid to the cleaning chamber and/or into a fluid tank via the recirculation path in at least one operating state after said cooling fluid has flowed through the heat recovery device. The cleaning appliance is also designed to feed the first cooling fluid to the latent heat accumulator by means of the heat accumulator path in at least one standby mode.

21 Claims, 4 Drawing Sheets

FOREIGN PATENT DOCUMENTS

| | | |
|---|---|---|
| DE | 196 22 882 A1 | 12/1997 |
| DE | 198 13 924 A1 | 9/1999 |
| DE | 10 2004 003 797 A1 | 8/2005 |
| DE | 10 2005 012 114 A1 | 7/2006 |
| DE | 10 2005 046 733 A1 | 4/2007 |
| EP | 0 842 382 B1 | 5/1998 |
| WO | WO 2005/018408 A1 | 3/2005 |
| WO | WO 2006/029953 A1 | 3/2006 |

\* cited by examiner

DISHWASHER WITH A LATENT HEAT ACCUMULATOR

This nonprovisional application claims priority under 35 U.S.C. §119(a) to German Patent Application No. DE 10 2007 053 381, which was filed in Germany on Nov. 9, 2007, and which is herein incorporated by reference.

BACKGROUND OF THE INVENTION

1. Field of the Invention

The invention relates to a cleaning appliance for cleaning washware in a cleaning chamber, with the cleaning appliance having a heat recovery device. The invention also relates to a method for recovering heat in a cleaning appliance. Such cleaning appliances and methods for recovering heat are used, for example, in large-scale catering establishments for cleaning dishes, glasses, cups, cutlery, trays or similar washware. However, other fields of use and types of washware, in particular in the commercial sector, are also feasible.

2. Description of the Background Art

Cleaning appliances by means of which various types of washware can be cleaned with different objectives in view are known in the conventional art. One objective is, for example, that of at least largely freeing the washware from adhering residues of dirt; another objective, which can be realized as an alternative or in addition, is that of sanitizing the washware, which can range as far as disinfecting the washware. Cleaning is generally performed by subjecting the washware to the action of at least one cleaning fluid which can comprise, for example, a liquid cleaning fluid (for example one or more washing liquids, for example water mixed with a detergent and/or a rinse aid) and/or a gaseous cleaning fluid, for example steam.

In many instances, a considerable quantity of thermal energy has to be applied in a cleaning appliance of this type. This thermal energy may be required directly during the cleaning process, for example since the cleaning fluid is applied to washware at an elevated temperature. For example, rinsing liquids having a temperature of approximately 85° C. can be used for a rinsing operation in a dishwasher. A further example is the thermal energy which is required to generate the steam in steam sterilizers and/or steam disinfection appliances. Furthermore, cleaning appliances can also be designed in such a way that one or more drying steps are carried out. In the case of such drying, the washware can be subjected to the action of hot air, for which purpose thermal energy likewise has to be expended.

This outlay on thermal energy can be considerable in the commercial sector in particular, and so, for example, heating capacities can make a considerable contribution to the overall operating costs of the cleaning appliance. In commercial dishwashers, the heating capacities range, for example, from a few 10 kW to a few 100 kW, depending, for example, on the operating state and/or the configuration of the dishwasher.

A further problem in known cleaning appliances, particularly in the field of commercial use, is that they are generally used in a work environment which should not be excessively loaded by waste heat from the cleaning appliance, particularly by damp waste heat. Therefore, considerable outlay is required, for example in large-scale catering establishments, in order to avoid conducting damp waste heat, which is formed in the dishwashers, directly into the work environment, since the working conditions in this work environment would otherwise become unacceptable within a short time. To that extent, for example, complicated on-site exhaust-air devices are required in order to discharge the damp waste heat from the work environment. As an alternative or in addition, the cleaning appliances can have drying apparatuses, in order to draw moisture from the exhaust air and/or to cool the exhaust air.

Numerous drying apparatuses which assist drying of the washware and fundamentally also dehumidify the exhaust air emitted into the surrounding area are known from the prior art. One drying concept which is known from the prior art involves equipping cleaning appliances with what are known as latent heat accumulators. Latent heat accumulators are devices which can store thermal energy by utilizing the enthalpy of reversible thermodynamic state changes in an accumulator medium (called heat accumulator materials in the text which follows). A typical example of such reversible thermodynamic state changes are, for example, phase transitions (for example melting/solidification) or reversible chemical reactions, for example to absorption and desorption processes which are based on chemical sorption, or processes in which a crystallization phase transition takes place. One example of a domestic dishwasher in which a thermally insulated heat exchanger with a latent heat accumulator is used is described in DE 37 41 652 A1. Other examples of such domestic appliances comprising similar apparatuses with latent heat accumulators can be found in DE 37 00 567 A1 (a baking oven in that document), in DE 10 2005 012 114 A1 (a dishwasher) or in DE 196 22 882 C2 (again a dishwasher). DE 29 16 839 describes, in general, a method for extracting thermal energy from hot liquids, in which method the liquids flow in succession through a plurality of latent heat accumulators which are operated at different temperature levels.

A further example of a drying principle is drying apparatuses which operate with the aid of Peltier elements. An example of a drying apparatus of this type is known from DE 198 13 924 A1. This document describes a condensation device for a domestic appliance, comprising a module element with a Peltier element. The Peltier element has a heat-absorbing surface and a heat-emitting surface. The heat-absorbing surface draws heat from a work space atmosphere of a work space of the domestic appliance, as a result of which moisture from the work space atmosphere condenses at the cooled location and therefore a drying operation of the domestic appliance is more effective and quicker. The heat-emitting surface of the Peltier element can also be coupled to a heat-absorbing volume, for example a water container.

However, from the point of view of commercial applicability, the apparatus described in DE 198 13 924 A1 has the disadvantage that, if the Peltier element heats up to too great an extent, the water container for cooling said Peltier element has to be emptied and filled with fresh water. To that extent, on the one hand, the functionality of the condensation device is unstable and can fluctuate over a relatively long operating time. This can be a considerable disadvantage, particularly in commercial cleaning appliances which, for example, have to operate continuously for several hours. Moreover, a safe and reliable drying operation is not ensured in all instances because of the described temperature drift in the water container. Furthermore, the energy contained in the waste heat is lost, and even additional energy has to be expended in order to operate the Peltier element.

Cooling appliances are also known from the field of air-conditioning technology, in which cooling appliances Peltier elements for conditioning room air and other media are used. Therefore, for example, EP 0 842 382 B1 describes a compact H-thermal appliance which comprises thermocouple blocks having a plurality of Peltier elements. In this case, thermal energy is transferred from a medium on a cold side to a medium on a hot side. In this case, it is proposed, inter alia, to collect the hot water which is produced as service water and make it available for further use. Overall, however, the design described in EP 0 842 382 B1 is comparatively complex.

Cleaning appliances are known from the field of commercial dishwashers, which cleaning appliances not only attempt to mitigate the described problem of loading the surrounding area with exhaust air, but are also designed to allow at least partial heat recovery of the thermal energy contained in the waste heat. One example of systems of this type is illustrated in U.S. Pat. No. 3,598,131. In this case, steam is removed from a dishwasher by suction by means of a suction-removal apparatus and passed into a shaft and is conducted via a heat exchanger. The heat exchanger is in this case configured as porous material which is sprayed with fresh water. The condensed moisture is collected and is fed back to the dishwasher. A similar dishwasher with heat recovery is also illustrated in DE 10 2004 003 797 A1, which corresponds to U.S. Publication No. 20070131260.

However, the disadvantage of the cleaning appliance illustrated in U.S. Pat. No. 3,598,131 is that the functionality of the heat recovery device depends greatly on the temperature of the cold water sprayed on. If the dishwasher is operated, for example, in regions with a hot climate, then the "cold water" is usually at a temperature different to that in regions with a milder or even cool climate. To that extent, the functionality of the heat recovery device can fluctuate sharply, and selective dehumidification or cooling cannot be ensured in all cases.

A further disadvantage of the heat recovery device described in U.S. Pat. No. 3,598,131 is that cooling liquid mixes with the condensed water, so that, overall, the recirculated water is at a comparatively low temperature and generally has to be reheated before it can be fed to the cleaning operation again. Moreover, the described heat recovery device has disadvantages in hygiene terms, since there is a risk of bacteria growing in the condensed water and therefore in the washware or the porous heat exchanger.

A further disadvantage of known heat recovery devices, for example the devices described in U.S. Pat. No. 3,598,131 or in DE 10 2004 003 797 A1, is that apparatuses of this type cannot operate satisfactorily in all operating states. Therefore, what is known as a standby mode, that is to say a mode in which the cleaning device is made and kept ready for operation without the cleaning process actually being carried out, is provided, particularly in commercial dishwashers, in many cases. During this time, at least one fluid tank for a cleaning fluid is usually heated in order to establish or maintain readiness for operation. This results in the production of steam vapors which generally have to be dispelled from the cleaning device in order to prevent an overpressure. Therefore, vapors and waste heat which could load the ambient air would be produced as early as in the standby mode. However, the known heat recovery devices are suitable to a limited extent for eliminating these vapors since no fresh water which could absorb the heat and feed it back to the cleaning device flows in the standby mode. However, additional consumption of fresh water would increase the operating costs. Heat recovery in the standby made would in any case be ended at the latest when one or more fluid tanks of the cleaning appliance is/are filled with heated water, since in this case the heated water would have to be disposed of in an outlet, and this would again waste the recovered energy.

Furthermore, it may be possible to use what are known as heat pumps to recover heat. Heat pumps are machines which, with provision of mechanical work, pump heat from a low temperature level to a higher temperature level. This can, in particular, counteract the problem of cooling water, after flowing through the heat recovery device, being at a comparatively low temperature and having to be heated up further after being recirculated to the cleaning appliance. In heat pumps, heat of evaporation is generally utilized in order, for example, to draw a quantity of heat from the waste heat of a dishwasher. However, heat pumps generally cannot be regulated as required, and, in practice, are restricted in terms of their control behavior, since only two-step control is possible. Moreover, the heat pumps have a defined operating point with a fixed tolerance which is not scalable. This presents problems in many instances, particularly for commercial use. Moreover, the use of heat pumps is in most cases associated with considerable additional costs and allowing for considerable installation spaces. Further disadvantages of the use of heat pumps include the noise occurring during operation, the high mechanical wear and vibrations.

SUMMARY OF THE INVENTION

It is therefore an object of the present invention to provide a cleaning appliance and a method for operating a cleaning appliance of this type, which cleaning appliance and method avoid the above-described disadvantages of known cleaning appliances and/or methods. A particular aim is to provide a heat recovery means which can be operated in a stable and reliable manner under various operating conditions, which can be used in a flexible manner and which permits efficient recirculation of heat. A particular aim is to be able to carry out heat recovery in a standby mode too.

An embodiment of the present invention proposes a cleaning appliance for cleaning washware, which cleaning appliance is designed to subject the washware to the action of at least one cleaning fluid in at least one cleaning chamber. The cleaning chamber can be configured to be closed (for example with an opening mechanism for loading and unloading washware) and/or partially open (for example provided with one or more loading openings) and is intended to ensure that cleaning fluid cannot splash, with obstruction, into the work environment, and that, for example, steam vapors cannot flow out of the cleaning appliance or can flow out of said cleaning appliance to only a reduced extent. The cleaning appliance can, for example, be configured fundamentally in accordance with one of the cleaning appliances described in the introduction. For example, the cleaning appliance can have a dishwasher, in particular a commercial dishwasher, although non-commercial dishwashers are also possible. Commercial dishwashers generally differ from domestic appliances in that, in order to be able to provide a cleaning fluid at a required cleaning temperature more quickly, a separate fluid tank (in particular a boiler and/or a flow heater), that is to say a fluid tank which is separate from the cleaning chamber, is provided, whereas in domestic appliances a change of water usually takes place within the cleaning chamber. The dishwasher can, for example, comprise a conveyor-type dishwasher, in particular a belt-conveyor machine and/or a rack-conveyor machine. As an alternative or in addition, said dishwasher can additionally also comprise a single-chamber dishwasher, in particular, again, for commercial use, for example a single-chamber dishwasher in the form of a front loader and/or a single-chamber dishwasher in the form of a top loader and/or a hood-type dishwasher. However, as an alternative or in addition to at least one dishwasher, the cleaning appliance can also contain another type of cleaning appliance for cleaning washware, for example a steam disinfection appliance and/or a steam sterilizer, for example for cleaning medical washware which is found in hospitals and/or care homes. However, other types of cleaning appliances are also possible. In addition to the appliances mentioned, the cleaning appliance can comprise further devices, so that, for example, a plurality of dishwashers are combined to form a wash line which can also comprise additional appliances required in large-scale catering establishments.

The cleaning appliance can include at least one fluid tank for storing the cleaning fluid, and one or more spray nozzles can then be fed with cleaning fluid from said fluid tank. This fluid tank can be designed to be separate from the cleaning chamber and/or can also be constructed as a constituent part of the cleaning chamber. Furthermore, the fluid tank can be configured entirely or partially as a pressure tank, but can also be configured entirely or partially as a pressureless tank. The refinement of the at least one fluid tank can be matched to the type of cleaning appliance. If, for example, a conveyor-type dishwasher having one or more cleaning zones is used, a fluid tank of this type can, for example, be assigned to each cleaning zone and/or a plurality of cleaning zones together. It is particularly preferred in this case when the conveyor-type dishwasher is designed in such a way that washware runs through the at least one cleaning zone in a passage direction. For example, the at least one cleaning zone can comprise at least one pump-action rinse zone and/or at least one fresh-water rinse zone which has at least one rinse tank, it being possible in this case for the at least one fluid tank to comprise, for example, the at least one rinse tank.

However, the term "fluid tank" can be interpreted broadly and can, but does not necessarily have to, comprise a container with a widened diameter for storing a quantity of cleaning fluid. The fluid tank can also be entirely or partially integrated in the cleaning chamber, for example by the fluid tank being formed in a base region of the cleaning chamber. However, as an alternative or in addition, the at least one fluid tank can also comprise a separate tank. A plurality of fluid tanks can also be provided, for example for different cleaning sub-processes. If a plurality of cleaning zones is provided, at least one fluid tank can be assigned, for example, to each cleaning zone, it being possible for one or more of these fluid tanks to be used for the heat recirculation process described below. Furthermore, the at least one fluid tank can comprise one or more pressurized and/or pressureless reservoirs for storing a quantity of cleaning fluid fed via a pipeline system, but can also be configured entirely or partially solely as a throughflow pipeline system in which the cleaning fluid can flow. Therefore, for example, the heated first cooling fluid, after flowing through a heat recovery device (see below), can also be fed directly to the fresh-water rinse zone, it being possible in this case for the pipeline system between the heat recovery device and the fresh-water rinse zone to be understood in a broader sense to mean a "fluid tank". This pipeline system can also be equipped, for example, with additional flow heaters in order to heat the first cooling fluid further. However, it is critical in this case that the first cooling fluid heated in the heat recovery device is fed back to the cleaning process in any form in order for the heat stored in this first cooling fluid to be reused.

As described above, the cleaning fluid can comprise, for example, at least one liquid and/or at least one gaseous cleaning fluid. It is assumed in the following description, without restricting the scope of the invention, that the cleaning fluid is an aqueous cleaning fluid, as is used, for example, in dishwashers. For example, a detergent and/or a rinse aid can be admixed to this aqueous cleaning fluid. However, other types of admixtures and/or compositions of the cleaning fluid are feasible and can be realized within the scope of the present invention. In particular, the cleaning fluid can be operated at a temperature which is elevated compared with room temperature, for example at temperatures in the region of 60° C. and/or temperatures in the range of from 80 to 90° C., for example 85° C. The latter is favored particularly for rinsing. However, other types of temperature organization are likewise feasible.

In order to mitigate the above-described problem of loading the work environment of the cleaning appliance with damp air, in particular with steam vapors, the cleaning appliance has a suction-removal apparatus for removing damp air from the cleaning chamber by suction. This suction-removal apparatus can have, for example, an exhaust-air opening through which the damp air (for example after passing through the heat recovery device described below) is discharged from the cleaning appliance. This exhaust-air opening can issue, for example, directly and/or via a filter into the work environment of the cleaning appliance. However, as an alternative or in addition, the at least one exhaust-air apparatus can also be connected to an exhaust-air device, provided on site, for example a venting pipe.

The terms "suction-removal apparatus" and "removal by suction" can again be interpreted broadly and can include, for example, active removal of the damp air by suction (for example by means of one or more suction-removal blowers). However, as an alternative, the suction-removal apparatus can also be configured without a blower and, for example, comprises only the at least one exhaust-air opening. In this case, it is then possible to use for suction-removal purposes, for example, a vacuum prevailing on site at the exhaust-air device, or, as an alternative or in addition, an excess pressure of the damp air, as compared with the ambient air, or special air flows which are conducive to discharging damp air from the cleaning appliance, or simply convection of the damp air. Removal by suction and the suction-removal apparatus are therefore to be defined merely in that they allow and/or promote the discharge of the damp air from the cleaning appliance in any way.

The cleaning appliance also has at least one heat recovery device. This heat recovery device is designed to draw heat from the damp air and to feed this heat back to the cleaning appliance or to a simultaneous or subsequent cleaning process via a first cooling fluid.

However, in contrast to known heat recovery devices, for example the heat recovery device described in U.S. Pat. No. 3,598,131 or the heat recovery device described in DE 10 2004 003 797 A1, the basic idea of the present invention is that of configuring the cleaning appliance in such a way that a latent heat accumulator is provided. However, in contrast to known cleaning appliances with latent heat accumulators, for example the cleaning appliances known from DE 10 2005 012 114 A1 or DE 37 41 652 A1, the latent heat accumulator is not permanently used for heat recovery or steam condensation but is switched on or off only as required. This basic idea serves the particular purpose of counteracting the above-described problem of eliminating vapor production in the standby mode. The cleaning appliance accordingly has a cooling-fluid line with at least one recirculation path and at least one heat accumulator path, with the at least one heat accumulator path comprising at least one latent heat accumulator. The cleaning appliance is designed to conduct the first cooling fluid to the cleaning chamber and/or into the fluid tank via the recirculation path in at least one operating state after said cooling fluid has flowed through the heat recovery device. In this case, an "operating state" is understood to mean, for example, at least one cleaning mode, that is to say a state in which the washware is subjected to the action of cleaning fluid. However, the cleaning appliance is also designed to feed the first cooling fluid to the latent heat accumulator by means of the heat accumulator path in at least one standby mode. Heat recovery therefore "differs" between the operating state (normal mode, cleaning mode) and the standby mode in which the washware is not subjected to the action of cleaning fluid.

The at least one operating state is therefore defined by the washware being subjected to the action of at least one cleaning fluid in said operating state. The operating state may comprise, for example, prewashing, main washing, rinsing or a combination of such washing and rinsing processes. The at least one standby mode is accordingly defined by the washware not being subjected to the action of the cleaning fluid in this state, or by the washware being subjected to the action of another type of cleaning fluid (for example steam), so that no cleaning fluid is generally required in this standby mode. The cleaning appliance can therefore be designed (for example by using a central control unit) in such a way that a changeover can be made between these operating states and/or standby modes. This changeover can be made physically by diverting the flow of the first cooling fluid between the recirculation path and the heat accumulator path, it additionally being possible to switch off heaters and/or pump motors too. By way of example, one or more valves, for example solenoid valves, can be provided between said parts for implementing this deflection or changeover.

Compared to conventional cleaning appliances, the proposed cleaning appliance therefore provides the advantage that efficient heat recovery, together with elimination of steam vapors, can also be performed in a standby mode in which no cleaning fluid is required.

The recovered heat can be temporarily stored in the latent heat accumulator in an efficient manner, in order to then, for example after the standby mode is ended and/or after the operating state (that is to say the at least one cleaning mode) is started, feed at least some of this heat back to the cleaning process. For this purpose, a fluid, in particular the first cooling fluid, can be used to transfer at least some of this heat back to the cleaning chamber and/or into the fluid tank. For this purpose, the first cooling fluid, for example, can be conducted just briefly through the heat accumulator path and/or through a transition path which comprises the latent heat accumulator after the operating state is started, for example during a transition phase, in order to transfer the heat stored in the latent heat accumulator into the fluid tank and/or to feed it to a cleaning process in the cleaning appliance in another way. As an alternative or in addition, it is also possible to transfer the stored heat from the latent heat accumulator into the fluid tank and/or into the cleaning chamber after the end of the standby mode in some other way, for example by means of a transfer fluid which differs from the first cooling fluid. Following the transition phase, the first cleaning fluid can then be conducted back via the recirculation path.

In this case, a "cooling fluid" is, hereinbelow, again understood, for example, to mean a liquid and/or gaseous medium which, for example, may be configured in an analogous manner to the cleaning fluid described above. Since, in this case, the first cooling fluid can also actually be used as cleaning fluid in a subsequent step, the first cooling fluid may again, for example, comprise an aqueous cooling fluid, for example fresh water with an admixture of detergents and/or rinse aids.

The latent heat accumulator can, in principle, be configured like the latent heat accumulator known from the abovementioned prior art and can comprise, in particular, at least one heat accumulator material which has a transition temperature (that is to say a conversion temperature or a conversion temperature range) in a suitable temperature range. In this case, a "suitable" temperature range is understood to mean a temperature range which firstly is above room temperature (so that the conversion has at least not yet fully taken place at room temperature) and which secondly is approximately in the temperature range in which the damp air is produced in the heat recovery device, in particular in the standby mode. A temperature range for the at least one transition temperature which is between 30° C. and 90° C., in particular in the range between 50° C. and 80° C. and particularly preferably at approximately 70° C., has proven particularly suitable here. In particular, the latent heat accumulator can also be configured as a multi-stage latent heat accumulator with at least two transition temperatures, for example by a plurality of heat accumulator materials being provided. In this case, the first cooling fluid can, for example, flow through the latent heat accumulator in such a way that said cooling fluid first flows through heat accumulator materials with relatively high transition temperatures and then through heat accumulator materials with relatively low transition temperatures. Reference can be made, for example, to DE 29 16 839 A1 for a possible refinement of this type.

Accordingly, a large number of heat accumulator materials and/or combinations of these heat accumulator materials can be used. The latent heat accumulator particularly preferably has at least one of the following heat accumulator materials: a salt; a paraffin; sodium acetate trihydrate; acetamide; t-crotonic acid; tristearin; potassium aluminum sulfate, in particular in hydrate form; sodium aluminum sulfate, in particular in hydrate form; magnesium nitrate, in particular in hydrate form.

Although an open heat accumulator path could, in principle, be used in the standby mode in order to transfer recovered heat from the heat recovery device to the latent heat accumulator, this refinement would be associated with the disadvantage of the first cooling fluid always being consumed in the process, so that, for example, when using fresh water, fresh water consumption would result. It is therefore preferred, in principle, when the heat accumulator path is configured as a closed circuit in which the first cooling fluid can circulate between the heat recovery device and the latent heat accumulator in the standby mode. The first cooling fluid is therefore always heated up in circulation in the heat recovery device, is conveyed to the latent heat accumulator, there gives up all or some of the absorbed heat to the latent heat accumulator, is cooled in the process and is finally transported back to the heat recovery device. This circuit can also be assisted by the heat accumulator path additionally having a pump for conveying the first cooling fluid. In this way, consumption of first cooling fluid can be reliably avoided even in the standby mode, so that it is not only possible to recover heat in the standby mode, but that the consumption of cooling fluid can also be reduced to a minimum. The proposed cleaning appliance is therefore distinguished from conventional cleaning appliances with a heat recovery device by means of high environmental compatibility and low operating costs.

Further advantageous refinements of the invention concern the heat recovery device as such. In principle, waste heat can be transferred directly, for example in a fluid heat exchanger, from the damp air to the first cooling fluid, which is then used as a carrier medium in order to feed the recovered heat back to either the latent heat accumulator (standby mode) and/or to the cleaning process (operating state). However, this simple refinement of heat transfer is associated with the disadvantage already described above of the efficiency of the heat recovery in this case depending on the starting temperature of the first cooling fluid. In addition, heat transfer of this type is comparatively inefficient. In a preferred refinement of the heat recovery device, said heat recovery device therefore comprises a heat pump, in particular a thermomechanical and/or a thermoelectric heat pump. A heat pump of this type is configured in such a way as to pump heat from a relatively low temperature level to a relatively high temperature level by providing mechanical and/or electrical work. In a thermomechanical heat pump, the heat of liquefaction which is produced at the high temperature level can be utilized to heat, for example, the first cooling fluid.

In this case, it is particularly preferred to use thermoelectric heat pumps which comprise at least one Peltier element. The heat recovery device can accordingly have at least one Peltier element with a heat-absorption side and a waste-heat side. The heat-absorption side can be directly or indirectly utilized to draw heat from the damp air. However, in contrast to known Peltier dryers, for example the Peltier dryer known from DE 198 13 924 A1 with coupling of the waste-heat side to a simple water volume, the invention preferably provides a fluid heating apparatus which is in thermal contact with the waste-heat side. This fluid heating apparatus is preferably designed in such a way that a first cooling fluid flows through said fluid heating apparatus and in the process absorbs waste heat from the waste-heat side of the Peltier element. In contrast to DE 198 13 924 A1, this waste heat is fed back to the cleaning appliance by the first cooling fluid being conducted to the cleaning chamber and/or into the fluid tank after flowing through the fluid heating apparatus, and it thus being possible to use said first cooling fluid for the cleaning process. The cleaning appliance is therefore configured in such a way that, after flowing through the fluid heating apparatus, the first cooling fluid, and therefore also the heat absorbed by this first cooling fluid, can be used in the cleaning chamber for a cleaning process.

In this case, the term "flow through" can be broadly interpreted. In principle, this term covers any type of transportation of the cooling fluid, here the first cooling fluid, during which transportation said cooling fluid then comes into thermal contact with the "element through which it flows", here the fluid heating apparatus. In addition to physically flowing through, the terms also covers "flowing across" and/or "flowing along" or a flow in the case of which the first cooling fluid flows along across one or more surfaces which are directly or indirectly associated with the fluid heating apparatus and permit heat transfer. More complex, for example indirect, heat transfer mechanisms can also be utilized and are to be covered by the term "flow through".

The proposed cleaning appliance therefore combines the advantages of known cleaning appliances having a heat recovery device with the advantages of the known Peltier dryers, while the disadvantages of both systems can be skillfully avoided. In this case, the comparatively low degrees of efficiency of the Peltier elements are advantageously utilized, even indirectly, since at least some of the waste heat produced can be recovered and can be fed to the cleaning appliance again. In contrast to heat recovery devices with pure liquid heat exchangers, heating up of the first cooling fluid after it flows through the fluid heating apparatus is not simply predetermined by temperature differences, but can be set, for example, by means of corresponding actuation of the Peltier element. To that extent, substantial independence of, for example, inlet temperatures of the first cooling fluid, for which purpose, for example, fresh water in the form of cold water can be used, can be afforded. To that extent, the cleaning appliance can be operated, for example, under different climatic conditions, without the functionality of the heat recovery device being adversely affected. In the heat recovery device, at least substantial and reliable dehumidification can also take place at the same time as cooling of the damp air, so that exhaust air can be discharged to the surrounding area, for example through the exhaust-air opening, said surrounding area corresponding to predefined limit values with regard to temperature and/or moisture. Since efficient cooling of the damp air can be ensured by means of Peltier elements, the cleaning appliance can to that extent contribute even to room air-conditioning.

In this case, a "Peltier element" is understood to mean, for example, a thermoelectric heat pump or an electrothermal converter which is based on what is known as the Peltier effect. For example, a Peltier element of this type can comprise two or more semiconductors which have a different energy level with regard to their conduction bands. If an electric current is conducted through two contact points of these materials which are situated one behind the other, energy is absorbed at one contact point, so that electrons can enter that conduction band of the adjacent semiconductor material which is arranged at a higher energy level. This therefore results in cooling. At the other contact point, electrons move from a higher to a lower energy level, so that energy is given up in the form of heat here. For example, a cooling capacity of the Peltier element can be controlled by setting the electric current, with conventional Peltier elements typically having a predefined maximum temperature difference between the two sides (heat-absorption side and waste-heat side). For example, the temperature difference may be up to approximately 60-70 Kelvin in single-stage Peltier elements, depending on the element and the current. According to the invention, at least some of the waste heat produced on the waste-heat side is utilized, so that firstly the water-changing problem, which is described in DE 198 13 924 A1, of the heat-absorbing volume can be avoided, and so that secondly this waste heat can even be utilized further.

However, in addition to "classic" thermoelectric elements of this type which are based on the Peltier effect, the term "Peltier element" also covers other types of thermoelectric elements, for example what are known as thermionic converters, within the scope of the present invention. Thermionic converters of this type are based on the knowledge that materials used in classic thermoelectric converters generally not only have good electrical properties, but also a comparatively high thermal conductivity. However, this thermal conductivity leads to a large portion of the transported heat flowing back to the actually cold side again. An equilibrium is established which reduces the degree of efficiency of the classic thermoelectric elements. Thermionic converters, which are to be considered as a special case of thermoelectric converters, improve efficiency by using thin tunnel layers, such as, for example, gaps or clearances in the structural elements, for example clearances of between 0.2 and 5 micrometers. While electrons can overcome these clearances by tunneling, these clearances act as efficient barriers to heat conduction, so that it becomes difficult for the heat to be transported back. The equilibrium is therefore displaced in favor of a heating of the hot side of the elements, so that the degree of efficiency of the thermoelectric elements rises overall. In order to make the tunneling of the electrons easier, base materials, that is to say materials with a low work function, are often used in the region of the gaps. Examples of such materials are alkaline and alkaline-earth metals or what are known as Avto metals. Modern examples of such thermionic converters, such as can be used within the scope of the present invention and likewise are covered by the term "Peltier elements", are what are known as "Cool Chips" from the company Cool Chips plc. in Gibraltar. It should be noted that the at least one Peltier element may also comprise a plurality of elements operating according to various physical principles, for example a combination of "classic" Peltier elements and Cool Chips.

The cleaning appliance according to the invention may also advantageously be developed by the heat recovery device being of multi-stage design. This concept is based on the idea that Peltier elements, irrespective of the temperature of the medium to be cooled, can cool the medium to be cooled, with the cooling depending, for example, solely on the applied current and/or the temperature difference between the heat-absorption side and the waste-heat side. In contrast to conventional liquid heat exchangers which are used in heat recovery devices and which can operate efficiently only at as high a temperature of the damp air as possible, Peltier cooling may therefore also be used as a following stage in a multi-stage heat recovery device in order to draw further heat from damp air which is already partially cooled.

Accordingly, the heat recovery device may comprise, for example, additional heat exchangers, of which all or some may be connected upstream of the Peltier element. For example, in this case, cooling coils, plate heat exchangers and/or irrigation heat exchangers (for example analogous to U.S. Pat. No. 3,598,131) may be employed. It is particularly preferred if the heat recovery device has at least one first fluid heat exchanger which is designed in such a way that it extracts a first quantity of heat from the damp air. The heat-absorption side of the Peltier element is accordingly designed in order to draw a second quantity of heat from the damp air. As described above, this is possible due to the fact that the "thermoelectric heat pump" of the Peltier element can operate even in the case of damp air which is already partially cooled. However, in contrast to other types of heat pumps, the Peltier element can be used quickly, can be switched off and/or on at any time and requires only a small installation space.

In this preferred refinement of the cleaning appliance, the first cooling fluid, in particular, can flow through the first fluid heat exchanger, with the first cooling fluid flowing through the fluid heating apparatus of the Peltier element after flowing through the first fluid heat exchanger. This refinement has the effect that the first quantity of heat which is drawn from the damp air in the first fluid heat exchanger is absorbed by the first cooling fluid. Subsequently, the second quantity of heat transferred by the Peltier element is additionally added to this first cooling fluid, so that the first cooling fluid can be heated to comparatively high temperatures. In contrast to conventional, pure liquid heat exchangers, the cooling fluid can therefore be heated even at least approximately to the temperatures required during subsequent cleaning of the washware or even above these temperatures, so that particularly high energy efficiency of the cleaning appliance can be ensured.

The above-described multi-stage principle of the heat recovery device can, of course, also be extended, for example, from the one first fluid heat exchanger described, which is followed by a Peltier element, to a plurality of fluid heat exchangers which are connected in series and/or a plurality of Peltier elements which are connected in series.

The first fluid heat exchanger can, in particular, comprise at least one open cooling-fluid line through which the first cooling fluid flows. This open cooling-fluid line can be connected to the fluid heating apparatus of the Peltier element at an outflow end. Furthermore, the cooling-fluid line can be connected to a cold-water connection at an inflow end. Between the inflow end and outflow end, the fluid heat exchanger can comprise, for example, cooling coils, cooling plates (for example cooling plates through or across which fluid flows) and/or other types of known heat exchangers which are designed in order to draw the first quantity of heat from the damp air.

As mentioned above, the at least one Peltier element can come into direct or indirect contact with the damp air, in order to draw the second quantity of heat from said damp air. In this case, "direct" coupling can be understood to mean, for example, coupling in which the damp air flows, for example, directly across the heat-absorption side of the Peltier element and/or a surface which is thermally coupled to this heat-absorption side. This can take place, for example, analogously to the refinement described in DE 198 13 924 A1, in which the heat-absorbing surface is directly connected to the medium to be cooled. A more complex refinement of the surface cooled directly by the Peltier element is also feasible, for example in the form of an refinement, which is likewise described in DE 198 13 924 A1, of the heat-absorption side in the form of large surfaces, for example in the form of chambers or interspaces through which the damp air can flow. Particularly efficient heat transfer is possible in this way.

However, it is particularly preferred within the scope of the present invention if the heat from the damp air is entirely or partially indirectly transferred to the Peltier element. To this end, the heat recovery device can also have, for example, at least one second fluid heat exchanger through which a second cooling fluid flows. As regards the possible refinements of this cooling fluid, reference can be made, for example, to the above description of the first cooling fluid, but it also being possible to select a different refinement in this case. It is preferred, in particular, if this second cooling fluid is subsequently not used as cleaning fluid, so that there is greater freedom in terms of selecting suitable materials for this second cooling fluid.

The second cooling fluid is preferably in thermal contact with the heat-absorption side of the Peltier element in at least one fluid cooling apparatus. This thermal contact can be established, for example, by suitable heat transfer elements. In this way, the second cooling fluid can, for example, first absorb the second quantity of heat from the damp air, then transport this second quantity of heat toward the fluid cooling apparatus, where this second quantity of heat is then transferred to the Peltier element. Heat is thereby transferred indirectly between damp air and the Peltier element.

As described above, the at least one Peltier element can be configured in various ways. For example, individual Peltier elements can be used which can also be connected in parallel next to one another, for example in order to increase the effective surface of the heat-absorption side and/or of the waste-heat side (parallel arrangement). However, as an alternative or in addition to a parallel arrangement of individual Peltier elements, it is also possible to stack a plurality of Peltier elements (stacked arrangement). Therefore, a plurality of Peltier elements can advantageously also be arranged such they are stacked in a cascade-like manner in Peltier stacks with in each case a heat-absorption side and in each case a waste-heat side. This arrangement is expediently made in such a way that in each case a heat-absorption side and in each case a waste-heat side of adjacent Peltier elements are in thermal contact with one another. In this way, for example the temperature difference which can be achieved between the waste-heat side and heat-absorption side can be increased by means of suitably stacking the Peltier elements.

If Peltier stacks of the described type are used, but possibly also if individual Peltier elements which are not stacked are used, an advantageous refinement, which is described below, is possible, in which a plurality of such individual Peltier elements and/or Peltier stacks are arranged such that they alternate with respect to their heat-absorption sides and their waste-heat sides and are combined to form a Peltier module. In this case, an "alternating arrangement" is understood to mean arrangements in which in each case the waste-heat sides of adjacent Peltier stacks face one another and/or in which in each case the heat-absorption sides of adjacent Peltier stacks face one another. Heat exchange regions which are in thermal contact with the Peltier stacks can then in each case be arranged between the Peltier stacks. Therefore, "face one another" is to be understood to mean any desired arrangement in which at least two heat-absorption sides of different Peltier stacks face a heat exchange region or in which at least two waste-heat sides of different Peltier stacks face a heat exchange region, with arrangements more complex than a linear arrangement of the Peltier stacks (for example star-shaped arrangements) also being possible of course. In this case, in each case at least one first heat exchange region can be in thermal contact with at least two waste-heat sides of the Peltier stacks which are adjacent to this first heat exchange region. In each case at least one second heat exchange region can be arranged in such a way that it is in thermal contact with at least two heat-absorption sides of the Peltier stacks. In this way, a layer structure can, for example, be provided, in which in each case heat exchange regions and Peltier stacks are arranged alternately. This can be done, for example, within the framework of a lamella-like design of the Peltier module, so that a particularly space-saving construction, together with a high degree of heat exchange efficiency, is possible. However, other types of design are also feasible.

The first heat exchange region can be utilized, for example, in order to transfer heat from the waste-heat side of individual Peltier elements or of the Peltier stacks to the first cooling fluid. The first heat exchange region can therefore comprise, for example, at least one cavity through which the first cooling fluid can flow. Within the framework of the described lamella-like design, these cavities can be configured, for example, as hollow plates through which the at least one first cooling fluid flows, so that a hollow area is available for heat exchange purposes.

Accordingly, the at least one second heat exchange region can be utilized in order to transfer heat efficiently from the damp air to the heat-absorption sides of the Peltier elements or of the Peltier stacks. As described above, this may take place, for example, by the second heat exchange region comprising at least one cavity (for example, once again, one or more cavities of hollow plates) through which the damp air flows directly. However, as an alternative or in addition, indirect heat exchange may again also be performed by means of a second cooling fluid. Therefore, the second cooling fluid can, for example, again flow through the at least one cavity of the second heat exchange region (for example hollow plates), so that heat can be transferred in a particularly efficient manner.

As described above, one particular advantage of the use of Peltier elements in heat recovery devices is that Peltier elements, in contrast, for example, to conventional heat pumps, can be switched on and/or off and/or actuated in a flexible manner. This can be used in a targeted manner to control and/or to monitor the functionality of the heat recovery device.

Therefore, the heat recovery device can, for example, have at least one temperature sensor for detecting a temperature of the damp air and/or at least one moisture sensor for detecting a moisture content in the damp air. This at least one temperature sensor or moisture sensor can be arranged at various points in the air stream of the damp air. For example, at least one temperature sensor and/or moisture sensor can therefore be arranged upstream of the above-described heat exchanger or heat exchangers, within these elements and/or downstream of these elements, so that temperatures can be detected, for example, at various points. In particular, a final temperature can be detected which can monitor, for example, the temperature of the exhaust air before it is discharged to the surrounding area and/or to an exhaust air device (for example an on-site exhaust air pipe). If limit values are exceeded, it is possible, for example, to issue warnings to a user and/or to initiate active processes, for example control or regulation processes. In addition to one or more temperature sensors, it is possible, as an alternative or in addition, to also provide other types of sensors, for example moisture sensors or other types of sensors.

It is particularly preferred if the heat recovery device also comprises at least one electronic control apparatus. This electronic control apparatus, which can be entirely and/or partially integrated in a central control device of the cleaning appliance but which may also be configured as an independent or decentral control device, can be used to control the functionality of the heat recovery device. This electronic control apparatus can therefore be used, for example, to control and/or regulate the exhaust-air temperature and/or the exhaust-air moisture. To this end, the electronic control device can be designed, for example, to control and/or to regulate a cooling capacity of the at least one Peltier element. For example, an electric current flowing through the at least one Peltier element can be controlled and/or regulated in accordance with a control and/or regulating signal. The electronic control apparatus can, for example, also control the changeover between the standby mode and an operating state, and possibly the introduction of the transition phase. To this end, the control apparatus can, for example, be in contact with further sensors, for example sensors which detect the state of the latent heat accumulator ("charge state"), that is to say for example detect the temperature of this latent heat accumulator and/or the extent to which a phase transition has occurred in the latent heat accumulator, for example a solid/liquid phase transition, in order to accordingly control, for example, the transition phase.

As described above, the invention can be used, in particular, within the framework of commercial cleaning appliances, in particular commercial dishwashers. It is particularly preferred if the fluid tank comprises a boiler and/or a flow heater. As described above, the cleaning appliance can comprise, for example, a conveyor-type dishwasher with at least one cleaning zone, with the washware passing through this at least one cleaning zone in a passage direction. The at least one cleaning zone can comprise, for example, at least one pump-action rinse zone and/or one fresh-water rinse zone in which the temperature of the cleaning fluid (rinse liquid) is generally particularly high, for example a temperature of approximately 85° C. The pump-action rinse tank of the pump-action rinse zone and/or use in the fresh-water rinse zone (for example in the form of a direct supply and/or in the form of a supply to a fresh-water rinse tank) are/is therefore particularly suitable for heat recirculation.

In addition to the at least one cleaning zone, the conveyor-type dishwasher can also have at least one drying zone which is preferably arranged downstream of the at least one cleaning zone in the passage direction. This drying zone can have, in particular, a blower in order to subject the washware to the action of hot air. It is particularly preferred in this case if the blower and the suction-removal device are designed or interact in such a way that an air stream opposite to the flow direction is formed in the conveyor-type dishwasher during operation. This development of the invention has, in particular, the advantage that the damp air is conducted opposite to the passage direction within the cleaning zones with an increase in absorption of moisture, in order to finally be subjected to suction-removal, for example in a first cleaning zone. The damp air has therefore preferably absorbed waste heat from all zones of the dishwasher and is therefore at a particularly high temperature for heat recovery.

In addition to the cleaning appliance in one of the above-described embodiments, the invention also proposes a method for heat recovery in a cleaning appliance. This method can be used, in particular, in a cleaning appliance according to one of the above-described embodiments, and so reference may largely be made to the above description for possible exemplary embodiments of the cleaning appliance used. However, the method can also be used in other refinements of cleaning appliances.

The cleaning appliance is designed to subject the washware in at least one cleaning chamber to the action of at least one cleaning fluid (operating state, normal mode, cleaning mode). The cleaning appliance has a suction-removal apparatus for removing damp air from the cleaning chamber by suction, and at least one heat recovery device. Said heat recovery device is designed to draw heat from the damp air and feed it back to the cleaning appliance by means of a first cooling fluid. The cleaning appliance has a cooling-fluid line with at least one recirculation path and at least one heat accumulator path with at least one latent heat accumulator. The method is configured in such a way that the first cleaning fluid is conducted to the cleaning chamber and/or into a fluid tank via the recirculation path in at least one operating state after flowing through the heat recovery device. In a standby mode, the first cooling fluid is fed to the latent heat accumulator by means of the heat accumulator path, so that this first cooling fluid can transfer heat from the heat recovery device to the latent heat accumulator.

As mentioned above, at least some of the heat which is stored in the latent heat accumulator can be transferred to the cleaning chamber and/or into the fluid tank, with the aid of a fluid, in particular the first cooling fluid and/or a separate transfer fluid, after the end of the standby mode and/or after the beginning of the operating state, for example during a transition phase, in order to thus feed it back to the cleaning process.

Reference can be made to the above description for further possible refinements of the method, since the intended uses or manners of operation imply method steps which correspond to the individual refinements of the cleaning appliance.

As described above, the heat recovery device can, in particular, have at least one Peltier element which has at least one heat-absorption side and at least one waste-heat side. The method can be carried out in such a way that heat is drawn from damp air from the cleaning appliance by means of the absorption side, with the waste-heat side of the Peltier element being cooled by means of the first cooling fluid. This first cooling fluid can then be transferred to the recirculation path and/or to the heat accumulator path. In this way, at least some of the heat which is absorbed on the waste-heat side of the Peltier element can be fed back to the cleaning appliance or to the latent heat accumulator. This first cooling fluid can then be used, for example, to clean the washware. Reuse can be performed, in particular, continuously and/or sequentially, depending on the design of the cleaning appliance.

As described above, heat recovery can also be performed in a cascaded or multi-stage manner. Therefore, the heat recovery device can have, for example, at least one first fluid heat exchanger which is designed to draw a first quantity of heat from the damp air. The heat-absorption side of the Peltier element can be designed to draw a second quantity of heat from the damp air, with the first cooling fluid first flowing through the first fluid heat exchanger and then cooling the waste-heat side of the Peltier element.

As likewise described above, the method can also be advantageously developed in such a way that a temperature and/or a moisture content of the damp air can be controlled and/or regulated after flowing through the heat recovery device by at least one cooling capacity of the Peltier element being controlled and/or regulated.

The cleaning appliance is designed to subject the washware to the action of at least one cleaning fluid, with the cleaning appliance having at least one heat recovery device which is designed to draw heat from the damp air. As described above, the heat recovery device has at least one Peltier element which has at least one heat-absorption side and at least one waste-heat side. The method is carried out in such a way that heat is drawn from damp air from the cleaning appliance by means of the absorption side, with the waste-heat side of the Peltier element being cooled by means of a first cooling fluid. This first cooling fluid is then conducted into the fluid tank in order to feed at least some of the heat which is absorbed on the waste-heat side of the Peltier element back to the cleaning appliance. This cooling fluid can then be used, for example, for cleaning the washware. This reuse can be performed, for example, continuously and/or sequentially, depending on the design of the cleaning appliance.

As likewise described above, heat recovery can also be performed in a cascaded or multi-stage manner. Therefore, the heat recovery device can have, for example, at least one first fluid heat exchanger which is designed to draw a first quantity of heat from the damp air. The heat-absorption side of the Peltier element can be designed to draw a second quantity of heat from the damp air, with the first cooling fluid first flowing through the first fluid heat exchanger and then cooling the waste-heat side of the Peltier element.

As likewise described above, the method can also be advantageously developed in such a way that a temperature and/or a moisture content of the damp air can be controlled and/or regulated after flowing through the heat recovery device by at least one cooling capacity of the Peltier element being controlled and/or regulated.

Further details and features of the invention can be found in the following description of preferred exemplary embodiments, in conjunction with the subclaims. In this case, the respective features may be implemented alone or severally in combination with one another. The invention is not restricted to the exemplary embodiments. The exemplary embodiments are schematically illustrated in the figures. The same reference numerals in the individual figures in this case designate identical or functionally identical elements or elements corresponding to one another in terms of their functions.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
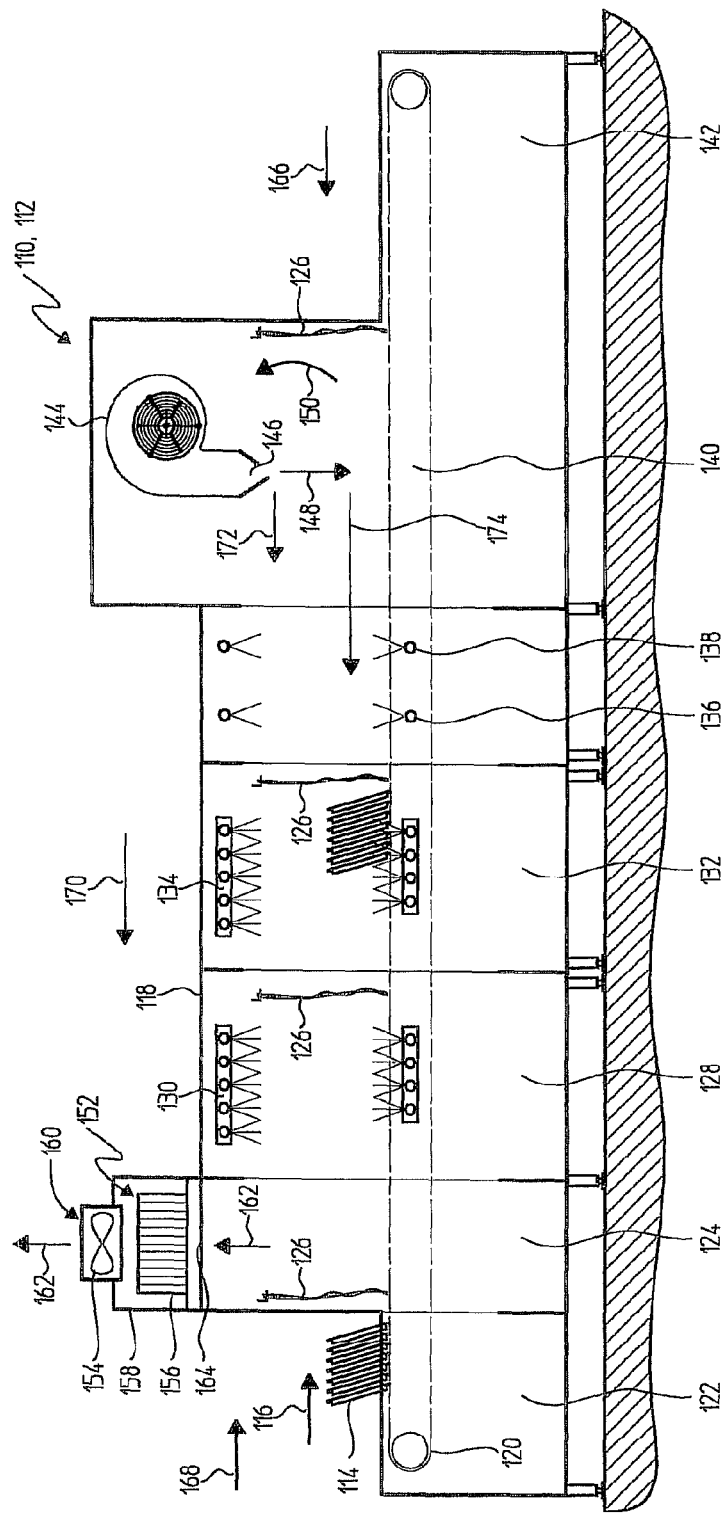
FIG. 1 shows an exemplary embodiment of a cleaning appliance in the form of a conveyor-type dishwasher.

FIG. 1 illustrates a possible exemplary embodiment of a cleaning appliance 110 according to the invention. In this exemplary embodiment, this cleaning appliance is configured as a conveyor-type dishwasher 112. Reference may be made largely to DE 10 2004 003 797 A1 as regards the design and the manner of operation of this conveyor-type dishwasher 112.

In the conveyor-type dishwasher 112, washware 114 runs through a cleaning chamber 118 in a passage direction 116. In the conveyor-type dishwasher 112 illustrated, the washware is transported by means of a conveyor belt 120. The conveyor-type dishwasher 112 is therefore configured as a belt-conveyor dishwasher.

Washware 114 held on the top side of the conveyor belt 120 enters an inlet tunnel 124 at an inlet 122. The inlet tunnel 124 is shielded from the outside by means of a separating curtain 126, in order to prevent steam vapors in the region of the inlet tunnel 124 of the conveyor-type dishwasher 112 escaping. After the washware 114 held on the top side of the conveyor belt 120 has passed through the inlet tunnel 124, it enters the cleaning chamber 118 which is subdivided into a plurality of cleaning zones. The washware 114 is first transported into a prewash zone 128. A prewash system 130 is arranged inside the prewash zone 128. The prewash system 130 has spray pipes which are arranged on the underside of or above the revolving conveyor belt 120. A variable-power pump (not illustrated in FIG. 1) subjects the prewash system 130 to the action of a cleaning fluid, depending on the degree of soiling of the washware 114. The prewash zone 128 is separated from a subsequent wash zone 132 by a further separating curtain 126. After passing through the prewash zone 128, the washware 114 runs into the wash zone 132. The wash zone 132 likewise comprises a wash system, designated by the reference symbol 134. The wash system 134 is arranged above and below the top side of the revolving conveyor belt 120. The wash zone 132 is separated by a further separating curtain 126 from a pump-action rinse zone 136 which has a wash system arranged above and a wash system arranged below the top side of the conveyor belt 120, the two wash systems being in the form of two spray pipes which are situated opposite one another. The pump-action rinse zone 136 is followed by a fresh-water rinse zone 138. Within the fresh-water rinse zone 138, the washware 114 is rinsed with fresh water, in order to remove impurities which have remained or the previously applied cleaning fluid from the washware before the washware enters a drying zone 140. The fresh-water rinse zone 138 is followed by a further separating curtain 126 (not illustrated in FIG. 1) which separates the fresh-water rinse zone 138 from the drying zone 140.

A drying blower 144 is located within the drying zone 140 which has a removal section 142 connected downstream. The drying blower 144 draws in air and heats it. The air heated in the drying blower 144 enters an outlet funnel 146 which has at its lower end an outlet nozzle which directs the emerging drying air onto the washware 114 passing through the drying zone 144. A deflection surface can be provided beneath the drying zone 144, said deflection surface deflecting the hot air emerging from the outlet nozzle in the outlet direction 148 in the direction of flow 150, so that some of said hot air flows back to the drying blower 144. As seen in the passage direction 116 of the washware 114, the drying zone 144 is shielded from the removal section 142 by a further separating curtain 126.

As the washware 114 is transported through the conveyor-type dishwasher 112 illustrated in FIG. 1, its temperature continuously increases. Starting from room temperature, the temperature of the washware 114 in the prewash zone 128 rises, for example, to a temperature of 40° C. to 45° C., in the following wash zone 132 to 55° C. to 65° C., and, in the following pump-action rinse zone 136 or fresh-water rinse zone 138, to a temperature of between 60° C. and 85° C.

The conveyor-type dishwasher 112 has a heat recovery device 152 which comprises a blower 154 and a heat exchange device 156. The two devices are arranged in a shaft 158 which issues into an exhaust air opening 160 in the region of which the blower 154 is arranged. In this exemplary embodiment, the shaft 158 is arranged in the region above the inlet tunnel 124. The configuration of the heat exchange device 156 and of the heat recovery device 152 is explained in greater detail below with reference to FIGS. 1 and 2. The blower 154, which is associated with the heat recovery device 152, generates a vacuum within the conveyor-type dishwasher 112, said vacuum enabling an exhaust-air stream 162 to be removed by suction at a suction-removal point 164. As described above, in the present exemplary embodiment, this suction-removal point 164 is arranged above the inlet tunnel 124, however, other refinements are also possible, for example arrangements of the suction-removal point 164 in one or more of the cleaning zones 128, 132, 136 or 138. Suction-removal of the exhaust-air stream 162 at the suction-removal point 164 prevents steam vapors from emerging from the conveyor-type dishwasher 112 at the inlet 122 and at the removal section 142. Firstly the separating curtains 126 arranged there and, secondly, the blower 154 which generates a vacuum serve this purpose. Gap-like openings, via which in each case external-air streams 166, 168 enter the conveyor-type dishwasher 112 and which correspond to the total volume of the exhaust-air stream 162, are located beneath the separating curtains 126 at the inlet tunnel 124 and at the removal section 142. Air guidance within the conveyor-type dishwasher 112 according to the illustration in FIG. 1 is selected in such a way that the exhaust-air stream 162 flows through the various cleaning zones 128, 132, 136, 138 through which the washware 114 runs, opposite to the passage direction 116, as is indicated by the reference symbol 170. The flow 170 of the exhaust-air stream 162 is firstly guided through the blower 154 which is associated with the heat recovery device 152 and, secondly, through the drying blower 144. The drying blower 144 can preferably have a variable configuration. Depending on the inclination of the outlet nozzles of the drying blower 144, a first, relatively small quantity 172 of air or a second, relatively large quantity 174 of air can, for example, be drawn from the drying zone 140. These quantities 172, 174 of air can be set by means of corresponding control of the drying blower 144 and of the blower 154, so that no steam vapors can escape from the conveyor-type dishwasher 112.

For further possible refinements of the conveyor-type dishwasher 112, reference may be made, for example, to DE 10 2004 003 797 A1. However, it should be noted that the cleaning appliances 110 can also be configured in another way, for example with an individual cleaning chamber which is equipped with a heat recovery device 152. A refinement with a plurality of cleaning chambers which in each case contain one or more heat recovery devices is also feasible.

Figure 2:
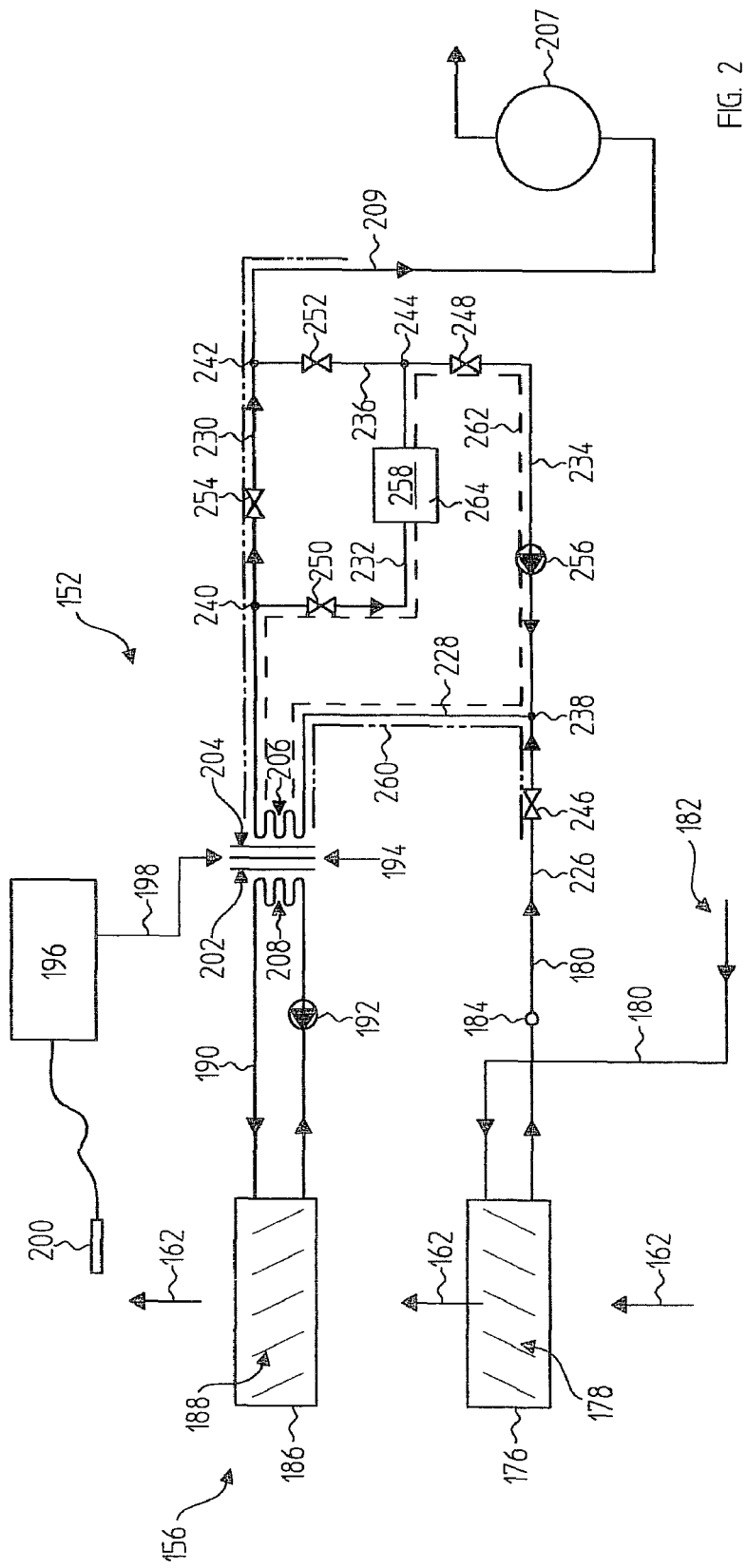
FIG. 2 shows a schematic illustration of an exemplary embodiment of a heat recovery device.

FIG. 2 schematically illustrates one possible exemplary embodiment of the heat recovery device 152 which can be used, for example, in the cleaning appliance 110 according to FIG. 1. This figure does not illustrate the blower 154 which creates the exhaust-air stream 162 of hot, damp air through a heat exchange device 156 and/or another type of device which promotes expulsion of this damp air.

The heat exchange device 156 comprises a first fluid heat exchanger 176 which is merely indicated in FIG. 2. This first fluid heat exchanger 176 can comprise, for example, a large number of first heat exchanger surfaces 178 which can be configured, for example, in the form of cooling coils, cooling surfaces, cooling plates through or across which fluid flows, lamellae or in analogous manner which is known to a person skilled in the art. Furthermore, the first fluid heat exchanger 176 has a cooling-fluid line 180 with an inflow end 182 and an outflow end 184. A first cooling fluid can flow through the first fluid heat exchanger 176 from the outflow end 184, then flows through the first heat exchanger surfaces 178, in order to finally flow to the outflow end 184. The inflow end 182 can, for example, be connected to a cold-water connection (fresh water).

The heat exchange device 156 also has a second fluid heat exchanger 186. This second fluid heat exchanger 186 can basically be configured in a similar manner to the first fluid heat exchanger 176 and can, for example, again have second heat exchanger surfaces 188. These heat exchanger surfaces can again have, for example, cooling surfaces through which fluid flows or across which fluid is sprayed, cooling coils, lamellae or similar types of heat exchanger surfaces to those which can also be used in the first exchanger surfaces 178. The second fluid heat exchanger 186 comprises a heat exchanger circuit 190 through which a second cooling fluid flows, so that the second fluid heat exchanger 186, overall, forms a closed system in which a second cooling fluid can circulate. This circulation can be assisted, for example, by a pump 192 in the heat exchanger circuit 190. It should be noted that pumps, valves or similar apparatuses, which drive or control the movement of fluid and are not illustrated in FIG. 2, may also be accommodated at other points in the heat recovery device 152 illustrated in FIG. 2.

Furthermore, the heat exchange device 156 comprises Peltier elements 194 which are merely indicated in FIG. 2, and, for more specific explanation of which, reference may be made, for example, to FIG. 3 below. The Peltier elements 194 are supplied with electrical energy, for example are subjected to the action of an electric current, by an electronic control device 196. This is indicated symbolically in FIG. 2 by the control line 198. Furthermore, the electronic control device 196 is optionally connected to a temperature sensor 200, for example a temperature-dependent measuring resistor which is arranged in the exhaust-air stream 162 on the outflow side of the second fluid heat exchanger 186. As an alternative or in addition to this arrangement of the temperature sensor 200, other arrangements of temperature sensors and/or arrangements of moisture sensors (not illustrated) can also be selected, for example arrangements between the first fluid heat exchanger 176 and the second fluid heat exchanger 186 and/or an arrangement upstream of the first fluid heat exchanger 176.

The Peltier elements 194 have a heat-absorption side 202 and a waste-heat side 204. During operation, the Peltier elements 194 act in such a way that heat is "pumped" (thermoelectric heat pump) from the heat-absorption side 202 to the waste-heat side 204.

Figure 3:
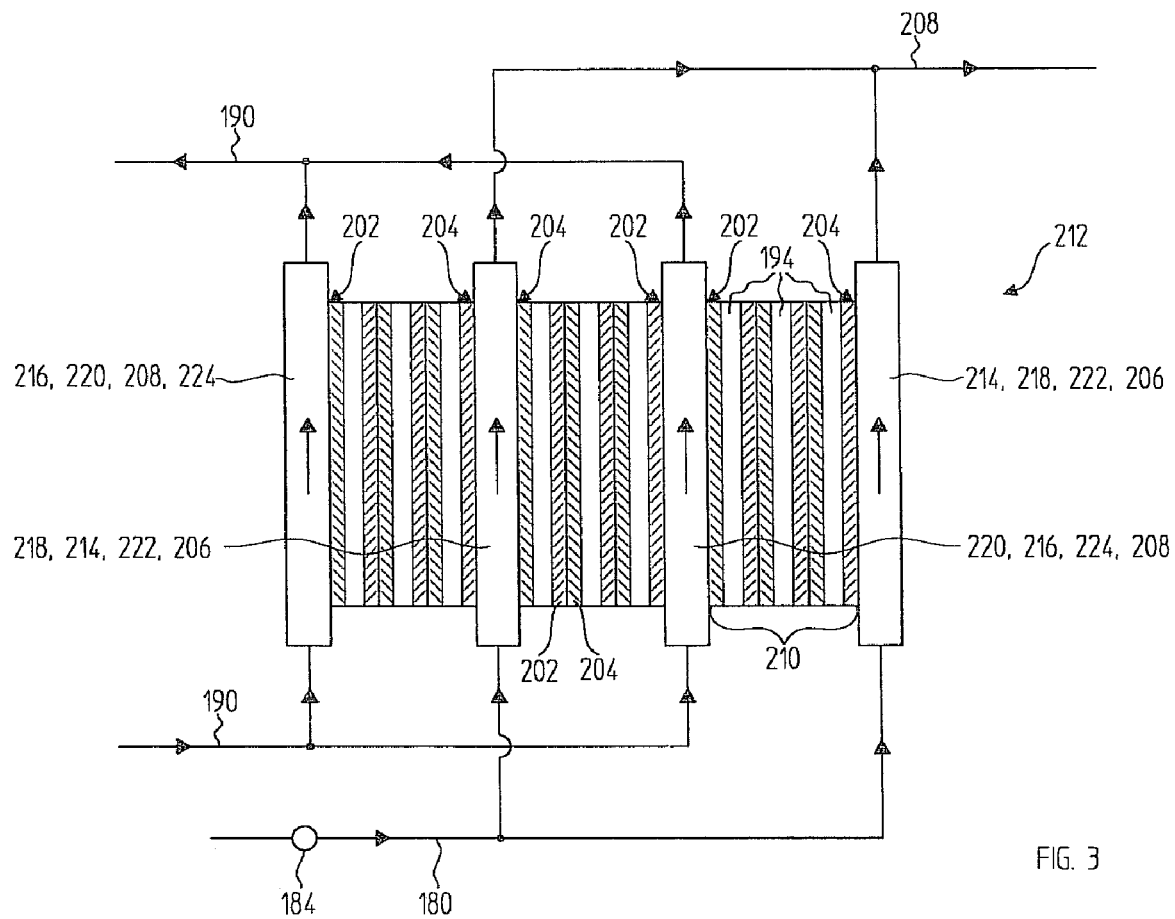
FIG. 3 shows one possible exemplary embodiment of a Peltier arrangement.

A fluid heating apparatus 206, which is indicated merely symbolically in FIG. 2 and for the implementation of which reference may be made to FIG. 3 for example, is provided on the waste-heat side 204. This fluid heating apparatus 206 is connected to the outflow end 184 of the cooling-fluid line 180, so that the first cooling fluid can flow through the fluid heating apparatus 206. The fluid heating apparatus 206 is in thermal contact with the waste-heat side 204, so that heat can be transmitted from this waste-heat side 204 to the first cooling fluid. The fluid heating apparatus 206 is connected to a fluid tank 207 via a discharge line 209. This fluid tank 207 can be configured, for example, as a boiler and/or as a flow heater, but can also be configured without an additional heating apparatus. The fluid tank 207 may be associated with, for example, one of the above-described cleaning zones 128, 132, 136, 138, with association with the pump-action rinse zone 136 and/or with the fresh-water rinse zone 138 being particularly preferred. In particular, association with the fresh-water rinse zone 138 is advantageous since extremely high temperatures are required in this case and since energy can be saved in an efficient manner by utilizing the waste heat from the damp air of the exhaust-air stream 162 for heating up the fluid tank 207.

As described above, the heat exchanger circuit 190 of the second fluid heat exchanger 186 is, in contrast, configured as a closed circuit. The heat exchanger circuit 190 is connected to a fluid cooling apparatus 208 which is indicated likewise merely schematically in FIG. 2 and for the exemplary configuration of which reference may be made to FIG. 3. In this fluid cooling device 208, second heat exchanger fluid can give up this absorbed second quantity of heat to the heat-absorption side 202 of the Peltier elements 194 after flowing through the second heat exchanger surfaces 188 and absorbing a quantity of heat from the exhaust-air stream 162.

The heat recovery device 152 and its heat exchange device 156 are therefore of two-stage design in the present exemplary embodiment according to FIG. 2. In the first fluid heat exchanger 176, the first cooling fluid flowing through the cooling-fluid line 180 absorbs a first quantity of heat. In the second fluid heat exchanger 186, the damp air of the now already slightly cooled exhaust-air stream 162 transmits a second quantity of heat to the second cooling fluid circulating through the heat exchanger circuit 190. This second quantity of heat, in addition to waste-heat capacities of the Peltier elements 194 and without heat loss quantities due to the Peltier elements 194, is additionally transferred to the first cooling fluid flowing through the cooling-fluid line 180, so that the said first cooling fluid is additionally heated up.

For example, the damp air of the exhaust-air stream 162 may be at a temperature in the range of between 80 and 90° C. before entering the heat exchanger device 156. The first cooling fluid, for example cold water, may be at a temperature of, for example, 10° C. on the side of the inflow end 182. The first fluid can be heated to a temperature of approximately 60° C. on the side of the outflow end 184, that is to say after passing through the first heat exchanger surfaces 178. After passing through the fluid heating apparatus 206, the first cooling fluid can finally be heated to temperatures of 70° C. to up to 85° C. or more, so that an optimum temperature is reached in the discharge line 209 to the fluid tank 207. The second cooling fluid in the heat exchanger circuit 190 may be at a temperature of approximately 10° C., for example before flowing through the second heat exchanger surfaces 188, as a result of the cooling in the fluid cooling apparatus 208. In the second heat exchanger surfaces 188, this second cooling fluid is then heated slightly, for example to a temperature of 12° C. In contrast to pure liquid heat exchangers, this slight heating and absorption of a second quantity of heat are sufficient to be transferred to the first cooling fluid by the Peltier elements 194. On the outflow side, the exhaust-air stream 162 can set a temperature of, for example, 15° C. after emerging from the second fluid heat exchanger 186. This temperature can, for example, be controlled and/or regulated independently of the starting temperature of the exhaust-air stream 162 and/or independently of the starting temperature of the first cooling fluid at the inflow end 182. To this end, the electronic control device 196 can, for example, correspondingly actuate the Peltier elements 194 in accordance with the signal from the temperature sensor 200, in order to raise or lower the cooling capacity.

It should be noted that the numerical values mentioned are to be understood as being merely exemplary, and that other temperature configurations are also possible. As an alternative or in addition to the two-stage configuration of the heat recovery device 152 as illustrated in this case, cascades with more than two stages are also feasible, for example by further fluid heat exchangers being provided.

In the exemplary embodiment illustrated in FIG. 2, the cooling-fluid line 180 has a first section 226, a second section 228, a third section 230, a fourth section 232, a fifth section 234, a sixth section 236 and the discharge line 209.

Starting from the first fluid heat exchanger 176, the first section 226 of the cooling-fluid line 180 branches at a first point of intersection 238 into the second section 228 and the fifth section 234. The fluid heating apparatus 206 is accommodated in the second section 228. Downstream of this fluid heating apparatus 206, the second section 228 forks at a second point of intersection 240 into the third section 230 and the fourth section 232. At a third point of intersection 242, the third section 230 forks into the discharge line 209 and the sixth section 236. Whereas the discharge line 209 leads to the fluid tank 206 (for example a boiler), the sixth section 236 forks at a fourth point of intersection 244 again into the fourth section 232 and the fifth section 234. The sections can have various valves by means of which the flow through these sections can be controlled. Valves 246 (in the first section 226), 248 (in the fifth section 234), 250 (in the fourth section 232), 252 (in the sixth section 236) and 254 (in the third section 230) are provided by way of example in the embodiment in FIG. 2. Another configuration of the valves or a combination of a plurality of valves (for example as three-way valves) is also feasible. Furthermore, a pump 256 is accommodated in the fifth section 234 in the exemplary embodiment in FIG. 2. A latent heat accumulator 258 is accommodated in the fourth section 232.

Furthermore, FIG. 2 indicates that the cooling-fluid line 180 forms at least two different paths. Therefore, firstly a recirculation path 260 which is identified with a dash-dotted line in FIG. 2 and a heat accumulator path 262 which is illustrated with a dotted line in FIG. 2 are provided. Whereas the recirculation path 262 comprises the sections 226, 228, 230 and 209 and is therefore configured as an open path in this exemplary embodiment, the heat accumulator path 262 comprises the sections 228, 232 and 234 and is therefore in the form of a closed path or closed circuit. Both paths 260, 262 include the fluid heating apparatus 206. The heat accumulator path 260 also includes the latent heat accumulator 258. This latent heat accumulator 258 can comprise, for example, a heat accumulator medium 264 of the above-described type. In accordance with the above-described temperatures, this heat accumulator medium 264 preferably has a transition temperature or conversion temperature in the region of approximately 70° C., so that this heat accumulator medium can optimally absorb the heat stored in the first cooling fluid after flowing through the fluid heating apparatus 206. In terms structure, the latent heat accumulator 258 can be designed, for example, in accordance with a latent heat accumulator described in the prior art, for example in accordance with the latent heat accumulator described in DE 37 41 652 A1 or the latent heat accumulator described in DE 29 16 839 A1. However, other structural refinements are also possible. The latent heat accumulator 258 can, for example, also be configured in a thermally insulating manner in such a way that it can store the stored thermal energy at least partly over a predefined period of time. Therefore, for example, the insulation means, which can comprise one or more insulation elements, can be configured in such a way that the thermal energy can be kept stored, for example overnight, and can be used in the morning when operation is started, for example as part of the process of filling and heating the conveyor-type dishwasher 112.

Figure 4:
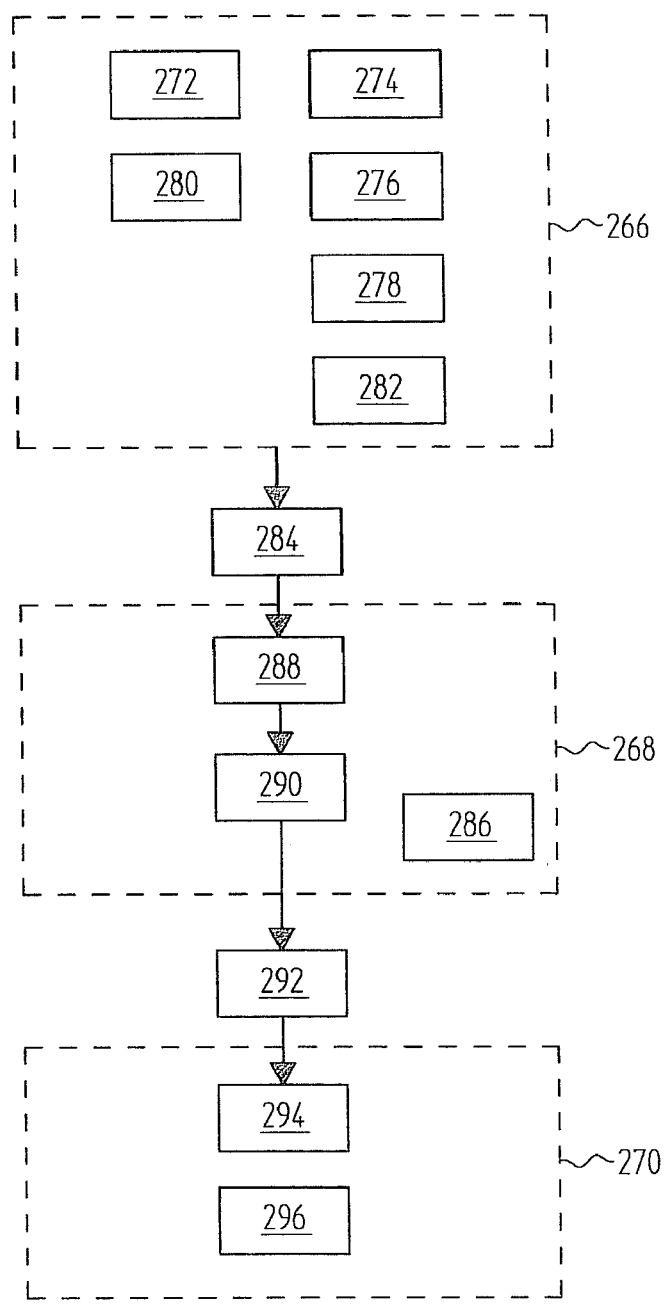
FIG. 4 shows a schematic flowchart of an exemplary embodiment of a method according to the invention for operating the cleaning appliance.

In order to explain the manner of operation of the cleaning appliance 110 and, in particular, the heat recovery device 152 in greater detail, FIG. 4 illustrates a highly schematic flowchart which comprises three operating phases, specifically a standby mode 266, a transition phase 268 and an operating state 270 (also called normal mode). It goes without saying that each of these three operating phases 268 to 270 in each case also contain sub-phases, it being possible, for example, for the normal made 270 to comprise a plurality of program steps, depending on the configuration of the cleaning appliance 110.

The fluid tank 207, which is configured, for example, as a boiler, is heated in the standby mode 266. Machine tanks of the individual wash zones, for example zones 128, 132, may already be at operating temperature and can therefore emit steam vapors. The cleaning appliance 110 is therefore prepared for a subsequent cleaning process, and steam vapors or damp air whose waste heat is to be recovered in the heat exchange device 256 are/is produced. Heating of the fluid tank 207 is symbolically denoted by reference numeral 272 in FIG. 4. At the same time, the valves 246, 252 and 254 are closed (reference numeral 274), the valves 248 and 250 are opened (reference numeral 276), and the pump 256 is in operation (reference numeral 278) in the standby mode 266. The heat accumulator path 262 is therefore active (reference numeral 280) and the latent heat accumulator 258 is charged (reference numeral 282).

It should be noted at this point that the latent heat accumulator 258 does not have to be charged exclusively via the Peltier element 194 in the standby mode 266. As an alternative or in addition, this latent heat accumulator 258 or a further latent heat accumulator (a plurality of latent heat accumulators can also be provided) can also be heated up directly by one or more fluid heat exchangers, for example the first fluid heat exchanger 176 and/or the second fluid heat exchanger 186. In this case, these fluid heat exchangers can, for example, likewise be integrated in the closed circuit of the heat accumulator path 262. Several refinements are possible. However, the refinement with the Peltier element 194 is particularly preferred since this permits particularly efficient heat transfer and, in particular, consistent matching of the temperature of the first cooling fluid to the transition temperature of the heat accumulator medium 264.

In step 284, the standby mode 166 is interrupted and a cleaning mode is started. This can be performed, for example, by manual user input and/or also can be automated, for example when a predefined temperature is reached in a fluid tank 207. This program step, like the other program steps in FIG. 4, can be entirely or partly controlled by the central controller 196 and/or another electronic controller which can, for example, also comprise one or more computers.

The transition phase 268 is accordingly initiated first. In this transition phase 268, a transition path (not identified in FIG. 2), which is made up of sections 226, 228, 232, 236 and 209 of the cooling-fluid line 180, is activated (reference numeral 286). To this end, the valve 248 is closed, the pump 256 is stopped and the valves 246, 250 and 252 are opened (step 288). The latent heat accumulator 258 is accordingly discharged via the above-described transition path (reference numeral 290). To this end, the heat contained and stored in this latent heat accumulator 258 can be transported into the fluid tank 207 by means of the first cooling fluid. It should be noted that ways of discharging of the latent heat accumulator 258 other than the way illustrated in FIG. 2 are also possible, so that, for example, the latent heat accumulator 258 can also be discharged by first cooling fluid or another cooling fluid which has not previously flowed through the fluid heating apparatus 206. For example, discharging could be performed via the sections 226, 234, 232, 230 and 209, with only one valve controller other than the valve controller illustrated in FIG. 2 being possible for this purpose. Discharging via a separate cooling fluid would also be feasible. As an alternative or in addition, indirect discharging via a further fluid circuit and/or by means of a further Peltier element could also be considered.

The transition phase 268 is ended in step 292. This can be done, for example, by it being detected (for example by means of one or more temperature sensors which are not shown in FIG. 2) that cooling fluid which has flowed through the latent heat accumulator 258 is heated to just an insignificant extent by this. It is also feasible to end the transition phase 268 after a firmly predefined or variable period of time.

After the transition phase 268 has ended, a changeover is made to the normal mode 270, that is to say to the operating state. To this end, the valves 250, 252 are closed, and the valve 254 is opened (all reference numeral 294 in FIG. 4). Accordingly, a normal mode is carried out, in which the recirculation path 260 is active (reference numeral 296) and therefore heat which is recovered by the heat recovery device 152 from the exhaust air 162 is fed back to the fluid tank 207.

The method illustrated in FIG. 4 can be extended or modified as desired. For example, a new standby mode 266 can be added or further method steps (not illustrated in FIG. 4) can be carried out. Also, although the time sequence illustrated in FIG. 4 is preferred, it is not firmly predefined, and so a plurality of methods steps can, for example, also be carried out in parallel and/or individual method steps can, for example, also be repeated or carried out in another order.

FIG. 3 shows an enlarged illustration of the Peltier elements 194 and also of the fluid heating apparatus 206 and the fluid cooling apparatus 208 which can be used, for example, in FIG. 2. It is shown here that the individual Peltier elements 194 are assembled to form Peltier stacks 210 in this exemplary embodiment. In this exemplary embodiment, each Peltier stack 210 contains, by way of example, three Peltier elements 194, with these Peltier elements 194 being assembled in such a way that the in each case one heat-absorption side 202 of a first Peltier element 194 is adjacent to a waste-heat side 204 of an adjacent Peltier element 194 ("head-to-tail arrangement"). In this way, each Peltier stack 210 accordingly has a waste-heat side 204 and a heat-absorption side 202. The arrangement of a plurality of Peltier elements 194 in Peltier stacks 210 permits a higher temperature difference between the waste-heat side 204 and heat-absorption side 202 than would be possible with individual Peltier elements 194. In the exemplary embodiment according to FIG. 3, a plurality of Peltier stacks 210 (in this case three Peltier stacks 210) are again combined to form a Peltier module 212. In this exemplary embodiment, the three Peltier stacks 210 are in this case oriented with a "head-to-head" arrangement with respect to one another, so that, for example, the waste-heat side 204 of the left-hand Peltier stack 210 faces the waste-heat side 204 of the middle Peltier stack 210. The heat-absorption side 202 of the middle Peltier stack 210 again faces the heat-absorption side 202 of the right-hand Peltier stack 210. In this case, exchanger plates 214, 216 which alternately form first heat exchange regions 218 and second heat exchange regions 220 are in each case arranged on the outer faces and between the Peltier stacks 210. Whereas the first exchanger plates 214 or the first heat exchange regions 218 are in thermal contact with the waste-heat sides 204 of the Peltier stacks 210, the second exchanger plates 216 or the second heat exchange regions 220 are in thermal contact with the heat-absorption sides 202 of the Peltier stacks 210. The exchanger plates 214, 216 have first and second cavities 222, 224 through which the first cooling fluid and the second cooling fluid can flow. Accordingly, the first cavities 222 are connected to the cooling-fluid line 180 or the discharge line 209, whereas the second cavities 224 are connected to the heat exchanger circuit 190. The first heat exchange regions 218 thus form the fluid heating apparatus 206, whereas the second heat exchange regions 220 form the fluid cooling device 208.

The Peltier stacks 210 and the exchanger plates 214, 216 can be held together, for example, by means of connection elements (not illustrated in FIG. 3), for example screws, clips or the like. In this way, heat can be efficiently transferred from the second cooling fluid to the first cooling fluid, with the Peltier elements 194 being interconnected.

It should be noted that the arrangement of the Peltier elements 194 which is illustrated in FIG. 3 constitutes only one of many possible exemplary embodiments. Other arrangements are also feasible, for example arrangements in which a plurality of Peltier elements 194 are arranged next to one another, as an alternative or in addition to a stack, in order to form as large exchange surfaces as possible for heat transmission. In this way, modules can thus be produced which, for example, may form surfaces with edge lengths of a few 10 cm. In addition to the "head-to-head" arrangement described above, non-linear arrangements, for example star-shaped arrangements, are also feasible. Furthermore, another type of throughflow of the Peltier modules 212 can be selected and further apparatuses can be provided in order to additionally increase the surface. In this way, the efficiency of heat transfer can be additionally improved by a suitable arrangement.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A cleaning appliance for cleaning washware, the cleaning appliance being designed to subject the washware to the action of at least one cleaning fluid in at least one operating mode, the cleaning appliance comprising:
   at least one cleaning chamber;
   a suction-removal apparatus for removing damp air from the at least one cleaning chamber by suction;
   at least one heat recovery device, the heat recovery device configured to draw heat from the damp air by a first cooling fluid; and
   a cooling-fluid line connected to the at least one cleaning chamber having at least one cooling path and at least one heat accumulator path branching off from said at least one cooling path, said at least one heat accumulator path including at least one latent heat accumulator;
   wherein the first cooling fluid flows to the cleaning chamber and/or into a fluid tank via the cooling path in said at least one operating state after said cooling fluid has flowed through the heat recovery device, wherein the first cooling fluid circulates through the cooling fluid line to the latent heat accumulator via the heat accumulator path in at least one standby mode, wherein the latent heat accumulator is a multi-stage latent heat accumulator with at least two transition temperatures, wherein the latent heat accumulator has at least one transition temperature in the range between 30° C. and 90° C., and wherein the heat recovery device has at least one thermoelectric heat pump and/or at least one thermomechanical heat pump, wherein the cooling fluid line has a first section, the first section branching at a first point of intersection into a second section, the second section forking at a second point of intersection into a third section and a fourth section, and wherein the latent heat accumulator is located in the fourth section of the cooling fluid line, the fourth section being parallel to the third section of the cooling fluid line, the third section being part of the cooling path.

2. The cleaning appliance as claimed in claim 1, wherein the latent heat accumulator has at least one of the following heat accumulator materials: a salt; a paraffin; sodium acetate trihydrate; acetamide; t-crotonic acid; tristerin; potassium aluminum sulfate, in particular in hydrate form; sodium aluminum sulfate, in particular in hydrate form; or magnesium nitrate, in particular in hydrate form.

3. The cleaning appliance as claimed in claim 1, wherein the latent heat accumulator has at least one transition temperature in the range between 50° C. and 80° C.

4. The cleaning appliance as claimed in claim 1, wherein the heat accumulator path is configured as a closed circuit in which the first cooling fluid circulates between the heat recovery device and the latent heat accumulator in the standby mode.

5. The cleaning appliance as claimed in claim 1, further comprising a plurality of valves operable to initiate, after the standby mode, a transition phase in which the heat stored in the latent heat accumulator is entirely or partially transferred to the cleaning chamber and/or into the fluid tank.

6. The cleaning appliance as claimed in claim 1, wherein the at least one thermoelectric heat pump comprises at least one Peltier element, the Peltier element having a heat-absorption side and a waste-heat side, the waste-heat side being in thermal contact with a fluid heating apparatus with a first cooling fluid flowing through the fluid heating apparatus, the first cooling fluid being conducted into the cooling path and/or into the heat accumulator path after flowing through the fluid heating apparatus.

7. The cleaning appliance as claimed in claim 6, wherein the heat recovery device has at least one first fluid heat exchanger that is configured to draw a first quantity of heat from the damp air, and wherein the heat-absorption side of the Peltier element is configured to draw a second quantity of heat from the damp air.

8. The cleaning appliance as claimed in claim 7, wherein the first cooling fluid flows through the first fluid heat exchanger, and wherein the first cooling fluid flows through the fluid heating apparatus after flowing through the first fluid heat exchanger.

9. The cleaning appliance as claimed in claim 6, wherein the heat recovery device further comprises at least one second fluid heat exchanger, wherein a second cooling fluid flows through the second fluid heat exchanger, and wherein the second cooling fluid, in at least one fluid cooling apparatus, is in thermal contact with the heat-absorption side of the Peltier element.

10. The cleaning apparatus as claimed in claim 9, wherein the second fluid heat exchanger has a heat exchanger circuit through which the second cooling fluid flows, and wherein the heat exchanger circuit comprises at least one heat exchanger region, which is in contact with the damp air and the fluid cooling apparatus.

11. The cleaning appliance as claimed in claim 9, further comprising a plurality of Peltier elements being arranged such they are stacked in a cascade-like manner in Peltier stacks, each having a heat-absorption side and a waste-heat side.

12. The cleaning appliance as claimed in claim 11, wherein the plurality of Peltier stacks are arranged such that they alternate with respect to their heat-absorption sides and their waste-heat sides and are combined to form a Peltier module, wherein heat exchange regions in each case being arranged between the Peltier stacks, wherein at least one first heat exchange region, in each case, is in thermal contact with at least two waste-heat sides of the Peltier stacks, and wherein at least one second heat exchange region, in each case, is in thermal contact with at least two heat exchange sides of the Peltier stack.

13. The cleaning appliance as claimed in claim 12, wherein the first heat exchange region and/or the second heat exchange region comprises at least one cavity.

14. The cleaning appliance as claimed in claim 1, wherein the cleaning appliance further comprises at least one conveyor-type dishwasher having at least one cleaning zone, the conveyor-type dishwasher configured such that the washware travels through the cleaning zone in a passage direction, the at least one cleaning zone comprising at least one rinse zone with at least one rinse tank, and wherein the first cooling fluid is conducted into the rinse tank after flowing through the fluid heating apparatus.

15. The cleaning appliance as claimed in claim 1, wherein the at least one transition temperature is 70° C.

16. The cleaning apparatus as claimed in claim 1, wherein said at least one heat accumulator path further includes a valve configured to open or close access to said at least one heat accumulator path.

17. An apparatus, comprising:
at least one cleaning chamber;
a suction-removal apparatus for removing damp air from the at least one cleaning chamber by suction;
at least one heat recovery device configured to draw heat from the damp air by a first cooling fluid; and
a cooling-fluid line connected to the at least one cleaning chamber, the cooling-fluid line including:
a first section, constituting a cooling path, extending from the at least one heat recovery device to the cleaning chamber and/or to a fluid tank;
a second section, constituting a heat accumulator path, branching off of the first section;
at least one latent heat accumulator disposed in the second section; and
a valve disposed on the cooling-fluid line, the valve configured to open and/or close access to the second section.

18. The apparatus according to claim 17, wherein the first cooling fluid flows to the cleaning chamber and/or into the fluid tank via the cooling path in at least one operating state, and wherein the first cooling fluid circulates to the latent heat accumulator via the accumulator path in at least one standby mode in which no cleaning fluid is used.

19. The apparatus according to claim 17, wherein the cooling-fluid line further includes a pump disposed in the second section.

20. The apparatus according to claim 17, wherein the second section reconnects to the first section such that the second section forms a closed loop.

21. A cleaning appliance for cleaning washware, the cleaning appliance being designed to subject the washware to the action of at least one cleaning fluid in at least one operating mode, the cleaning appliance comprising:
- at least one cleaning chamber;
- a suction-removal apparatus for removing damp air from the at least one cleaning chamber by suction;
- at least one heat recovery device, the heat recovery device configured to draw heat from the damp air by a first cooling fluid; and
- a cooling fluid line connected to the at least one cleaning chamber, the cooling fluid line having at least one cooling path and at least one heat accumulator path branching off from said at least one cooling path, said at least one heat accumulator path including at least one latent heat accumulator;

wherein the first cooling fluid flows to the cleaning chamber and/or into a fluid tank via the cooling path in said at least one operating state after said cooling fluid has flowed through the heat recovery device, wherein the first cooling fluid circulates through the cooling fluid line to the latent heat accumulator via the heat accumulator path in at least one standby mode, wherein the cooling fluid line has a first section, the first section branching at a first point of intersection into a second section, the second section forking at a second point of intersection into a third section and a fourth section, and wherein the latent heat accumulator is located in the fourth section of the cooling fluid line, the fourth section being parallel to the third section of the cooling fluid line, the third section being part of the cooling path.

* * * * *